United States Patent
Sellschopp et al.

(10) Patent No.: US 6,338,881 B1
(45) Date of Patent: Jan. 15, 2002

(54) DIAMOND-LIKE COATING AND METHOD OF MAKING SAME

(75) Inventors: Michael Sellschopp, Tuebingen; Guenther Durst, Kohlberg; Stefan Krall, Duernau, all of (DE)

(73) Assignee: Saxonia Umformtechnik GmbH, Goeppingen (DE)

( * ) Notice: Subject to any disclaimer, the term of this patent is extended or adjusted under 35 U.S.C. 154(b) by 0 days.

(21) Appl. No.: 09/254,276

(22) PCT Filed: Sep. 3, 1997

(86) PCT No.: PCT/EP97/04794

§ 371 Date: May 7, 1999

§ 102(e) Date: May 7, 1999

(87) PCT Pub. No.: WO98/10117

PCT Pub. Date: Mar. 12, 1998

(30) Foreign Application Priority Data

Sep. 3, 1996 (DE) .......................................... 196 35 736

(51) Int. Cl.[7] ............................. C23C 16/26; H05H 1/24
(52) U.S. Cl. .................... 427/577; 427/249.7; 427/575; 427/249.1; 427/249.8
(58) Field of Search ............................... 427/575, 577, 427/249.7, 249.1, 249.8; 428/423, 408, 457

(56) References Cited

U.S. PATENT DOCUMENTS

| 4,698,256 A | * | 10/1987 | Giglia et al. ................. 428/408 |
| 4,777,090 A | * | 10/1988 | Ovshinsky et al. ......... 428/408 |
| 5,015,494 A | * | 5/1991 | Yamazaki .................... 427/571 |
| 5,039,548 A | * | 8/1991 | Hirose et al. ................ 427/571 |
| 5,374,456 A | | 12/1994 | Matossian et al. |
| 5,458,927 A | | 10/1995 | Malaczynski |
| 5,541,003 A | | 7/1996 | Nakayama et al. |
| 5,601,883 A | * | 2/1997 | Yamazaki .................... 427/577 |
| 5,674,621 A | * | 10/1997 | Visser et al. ................. 428/408 |
| 5,674,638 A | * | 10/1997 | Grill et al. ............. 428/694 TC |
| 5,691,010 A | * | 11/1997 | Kuramoto et al. ........... 427/577 |
| 5,695,832 A | * | 12/1997 | Hirano et al. ................ 427/577 |
| 5,827,613 A | * | 10/1998 | Nakayama et al. ......... 428/408 |

FOREIGN PATENT DOCUMENTS

| DE | 214 392 | 9/1908 |
| DE | 30 47 888 | 7/1982 |
| DE | 37 03 078 | 8/1987 |
| DE | 44 23 184 | 1/1995 |
| EP | 0 259 792 | 3/1988 |
| EP | 0 336 979 | 10/1989 |
| EP | 550752 | 7/1993 |
| GB | 2 286 349 | 8/1995 |
| WO | WO 90/02213 | 3/1990 |

OTHER PUBLICATIONS

Silva et al., "Diamond–like carbon thin film deposition using a magnetically confined R.F. PECVD system", Diamond and related materials, May 1995 (X–000511926) pp. 977–983.

* cited by examiner

Primary Examiner—Bret Chen
(74) Attorney, Agent, or Firm—Crowell & Moring LLP

(57) ABSTRACT

A method for applying a diamond-like coating to at least one substrate includes arranging at least one substrate in a reaction chamber so that field lines extend between the at least one substrate and a ground electrode and perpendicularly intersect a clamping surface defined by the at least one substrate or the field lines perpendicularly intersect the clamping surface at an end of the at least one substrate closest to the clamping surface; and applying a diamond-like layer to the at least one substrate by plasma-enhanced chemical vapor deposition by exciting a deposition gas atmosphere with electromagnetic radiation and producing an electrical bias voltage between the substrate and at least one ground electrode.

38 Claims, 4 Drawing Sheets

DIAMOND-LIKE COATING AND METHOD OF MAKING SAME

BACKGROUND AND SUMMARY OF INVENTION

The invention relates to a method for producing a wear-resistant diamond-like coating (DLC) as well as a part subject to wear provided with such a coating, such as a part of a textile machine.

In certain machine parts, especially in textile machinery that processes thread, these parts are subject to high surface wear, with the surface either being constantly in contact with the moving thread or frequently coming in contact therewith, or coming in contact with other hard moving parts.

Specifically, when any part subject to wear must possess sufficient elasticity as a whole, attempts have already been made in many ways to treat the surface of such parts subject to wear, to reduce the wear.

In the past, this was accomplished by surface hardening of steel materials, mechanically changing the structure in the surface area by cold rolling for example or by applying a comparatively wear-resistant coating such as hard chrome plating.

In the recent past, attempts have also been made in industrial applications and for a wide variety of applications to apply to a substrate as a carrier, usually a metal material, a thin diamond layer, or a diamond-like layer, in other words a layer consisting of polycrystalline or microcrystalline diamond or hard amorphous carbon, also referred to as DLC (diamond-like carbon) or ACH (amorphous hydrogenated carbon).

Theoretically, such diamond-like layers are suitable for preventing wear in parts that come in contact with other parts that contact them two-dimensionally, as in the case of the parts of textile machinery that are subject to wear, for example the punch needles of a warp-knitting machine.

Such layers are usually deposited chemically by the CVD method from an atmosphere of gas or plasma, with the plasma being excited by exposure to the radiation of electromagnetic waves and certain pressure and temperature parameters as well as suitable precursors being present as starting materials for the deposition atmosphere.

In this connection, the diamond-like layer itself has proven to be less of a problem than its adhesion to the substrate and a layer deposition that is as uniform as possible over the areas to be coated. In order to improve adhesion, attempts have been made in the past first to apply an adhesion promoter layer to the substrate and then to deposit the diamond-like layer on top of that.

Adhesion in particular but also the deposition rate, in other words the speed with which a given layer is built up, depends on a favorable combination of the parameters involved in the method.

Therefore, one goal according to the invention is to provide a method for producing a diamond-like coating on the substrate which, despite rapid and economical buildup of the layer, produces good adhesion of the diamond-like coating to the substrate, preferably by means of an adhesion promoting layer located in between and thus to offer uniform quality over the area subjected to wear, as well as a part subject to wear that is provided with such a coating.

The deposition atmosphere is excited and the layer-forming hydrocarbons are split usually by means of exposure to radiation at radio frequency, approximately 13.56 MHz. But irradiation by other types of radiation from the kHz range to the microwave range of several GHz, and also by using DC voltage, pulsed DC voltage, medium- or high-frequency alternating fields, is also possible.

A plasma made of hydrocarbon gases for example, with or without the addition of other gases, is excited by the alternating field between the substrate and/or the substrate carrier, on which a plurality of individual substrates is usually located, and by means of the ground electrode, usually the inside wall of the reaction chamber. As a result of the bias voltage that forms on the substrate, positive ions are accelerated out of the plasma against the substrate and strike the substrate. The ion energies and ion densities of the plasma are of great significance for the properties of the coating.

The ion energies and ion densities of the plasma depend on both the gas and its pressure and on the applied electrical power and the geometry of both the parts and of their arrangement.

Therefore it has proven to be advantageous to locate the substrate in the reaction chamber on a theoretical clamping surface on which the substrates are located in such fashion that the electrical field lines that form between the ground electrode, in other words usually the inside walls of the reaction chamber or auxiliary electrodes provided for this purpose, and the substrate, to the greatest degree possible, terminate as perpendicularly as possible and spaced apart closely and uniformly, on this clamping surface.

When the clamping surface extends through the substrate, the field lines naturally terminate on the surface of the substrate to be coated and hence in front of the clamping surface. In this case, the ends of the field lines closest to the clamping surface at the end point should be directed to the greatest degree possible as perpendicularly as possible and spaced apart uniformly and closely, against the clamping surface.

Especially when a certain area is preferably to be coated on a substrate, the substrate can be located in such fashion that the main surface to be coated is located on or parallel to the clamping surface. In this case, the clamping surface for example can be an endless clamping surface that is a continuous ring in a top view within the reaction chamber. Then however a ground electrode must also be provided in its interior.

Frequently however the case arises that a two-dimensional, preferably even a plane two-dimensional part must be coated as a substrate, not only on the two two-dimensional sides but preferably also along the narrow sides. In this connection it frequently occurs in the case of parts subject to wear such as punch needles in warp-knitting machines that the inner surfaces of holes or the inwardly directed surfaces of cavities must be coated.

In this case of course, the simultaneous coating of both opposite side surfaces is desirable, for which reason a single, usually plane, surface is selected as the clamping surface, on which the relatively thin two-dimensional substrates are located in such fashion that their two-dimensional outer sides opposite one another are located on the left and right at a short distance from the theoretical clamping surface, so that the field lines that terminate on the outer sides of the substrate are directed predominantly at right angles against the clamping surface located in between.

A plane clamping surface as a rule is the standard plane of the three-dimensional arrangement of ground electrodes. With a parallelipipedic arrangement of ground electrodes, in other words a reaction chamber in the shape of a parallelepiped, in which the inner surfaces function as ground electrodes, this is preferably in the plane of symmetry of the central plane of the reaction chamber that runs parallel between the two largest inner surfaces opposite one another.

The substrates, particularly if the narrow sides of two-dimensional substrates are also to be adequately coated, must be located relative to one another in the clamping plane so that there is a sufficient distance between the substrates in order to allow a sufficient number of field lines to strike the narrow sides of two adjacent substrates facing one another. In particular, the covering of the clamping surface by the substrates, not by the substrate holders, should be only about 5 to 30% and preferably only 10 to 25%.

As the substrate, either carbon steel is used, which possibly has been hard chrome plated on the surfaces to be coated for example, or stainless steel, which consists of an alloy that contains chromium.

Also electrically non-conductible substrate are possible.

To produce the diamond-like layer, preferably the procedure is such that the substrates are initially precleaned in a suitable fashion, in other words degreased for example, treated with an alkaline cleaner, rinsed, etc.

Then, preferably in the reaction chamber itself, the oxide layer which is usually present on the surface of the substrate is removed, preferably by bombardment with argon ions or the ions of another noble gas. In theory, this can be referred to as atomic sand blasting.

Then the corrosive gas is removed and another gaseous material that serves as the precursor for formation of the deposition atmosphere for the adhesion promoting layer now to be applied is introduced.

Since the external diamond-like layer subject to wear consists of carbon and the under surface (substrate) consists of a metal lattice, usually an Fe lattice with chromium atoms embedded, the adhesion promoting layer should include a main component which (with respect to the outer diamond-like layer) can enter into a stable bond with the carbon there and/or is readily miscible with it, in other words it has approximately the same atomic size. This is the case for silicon for example, since silicon carbide represents a stable compound that can withstand mechanical loads, plus the fact that silicon is readily miscible with carbon.

On the other side, in other words between the adhesion promoter layer and the substrate, a good miscibility of the main component of the adhesion promoter layer with the outer surface of the substrate must be possible, or a stable chemical bond must be capable of being created.

The mixing can be promoted for example by bombardment with ions from the plasma or by influencing the temperature (in case high temperatures of the substrate are possible) which promotes diffusion as it rises. Bonding to the substrate takes place primarily due to the chemical bonding of the silicon to the atoms of the substrate.

Therefore, silicon is well suited as the main component of the adhesion promoter layer so that, as the precursor for this, gases are used with a silicon content that is as high as possible, such as hexamethyldisilazane, monosilane, or disilane, etc.

After the adhesion promoting layer has reached a thickness of least 10 angstroms, up to a few $\mu$m, preferably approximately 50 to 150 nm, the buildup of the adhesion promoter layer is terminated and a transition is made to building up the diamond-like layer.

For this purpose, the precursor is changed, with the precursor for the adhesion promoter layer no longer being supplied and with a new precursor being added to the reaction chamber as the basic material for the deposition atmosphere for the diamond-like layer, and the gas contained in the reaction chamber is drawn off at the same time.

This switch from one precursor to another can theoretically occur in seconds with powerful evacuation pumps, but should take place continuously over several tens of seconds to a few minutes in order to produce a mixing zone at the transition between the adhesion promoter layer and the diamond-like layer.

The DLC layer is built up to a thickness of several $\mu$m, preferably approximately 1 to 10, especially 2 to 3 $\mu$m. With layer thicknesses below 1 $\mu$m, the layer, despite its hardness, is removed too rapidly by wear, and with layer thicknesses above 10 $\mu$m, especially due to internal stresses that are too high, adhesion problems arise between the diamond-like layer and the intermediate layer and the substrate.

During deposition of the adhesion promoting layer as well as the diamond-like layer, as a rule a pressure of only $5 \times 10^{-3}$ mbar to $5 \times 10^{-1}$ mbar prevails. A pressure of 5 to 10 mbar is also possible. However, 2 to $20 \times 10^{-2}$ mbar, preferably approximately $5 \times 10^{-2}$ mbar, have proven to be the optimum range of values.

Materials containing carbon and especially hydrocarbons, especially the gases methane, butane, and hexane as well as acetylene, are used as precursors for the deposition atmosphere of the diamond-like layer.

The bias voltage varies in a range between 100 volts and 1000 volts, preferably 300 to 700 volts, preferably approximately 450 volts, but the bias voltage is not regulated directly but the power regulation of the radio frequency radiated into the chamber, which is controlled in such fashion that the desired bias voltage is achieved as a result.

In addition, an external voltage, for example a DC voltage, can be applied between the ground electrodes and the substrate, but this also involves additional problems.

Excitation takes place with a transmitting frequency of 13.56 MHz, which is authorized for the purpose in Germany by the Bundespost, but other frequencies are possible ranging from the kHz range to the microwave range as well as DC voltages and pulsed DC voltages, under which conditions other values can be selected for the bias voltage and pressure.

With the additional imposition of a magnetic field, it is also possible to work with $10^{-1}$ mbar.

The term "stainless steel" is understood in the present application to apply in particular to non-rusting steels.

An embodiment according to the invention will be described in greater detail below with reference to the figures.

DETAILED DESCRIPTION OF THE DRAWINGS

Figure 1:
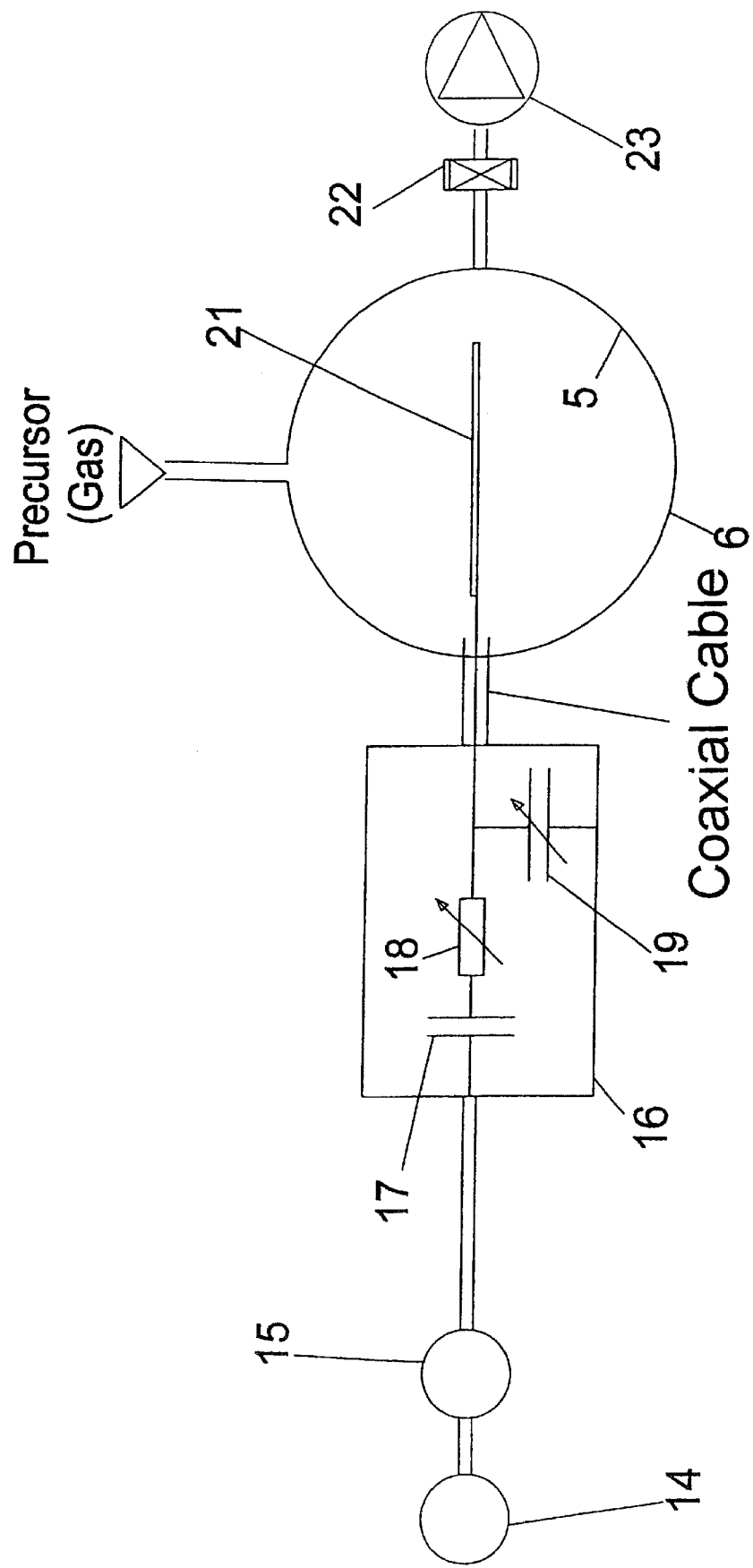
FIG. 1 shows the schematic diagram of a radio frequency reactor.

FIG. 1 shows reaction chamber 6 in which the substrate holder 21 is located with the substrates fastened to it but not shown. The substrate holder 21 is connected electrically with the external tuning circuit 16 which in turn is coupled with the frequency generator 14, with a power meter 15 located in this connection.

Tuning circuit 16 comprises at least one variable inductance 18 between frequency generator 14 and substrate carrier 21, as well as a variable capacitance 19, connected in parallel with inductance 18. Preferably an additional coupling capacitor 17 is connected in series with inductance 18 in order to prevent direct contact between the transmitter and the antenna, which is required in particular for connecting a fixed external bias voltage.

The phase relationship can be set using the tuning circuit.

The precursor, usually in the form of a gas, is admitted to reaction chamber 6, with the molecules of the precursor being excited by the supplied frequency to the point when they are partially cracked and are therefore available as free radicals, and ions are produced.

A constant relatively high vacuum is maintained in reaction chamber 6, with pump 23 constantly sucking gas out of reaction chamber 6, with the level of the vacuum being set by metering valve 22.

In FIG. 1, substrate carrier 21 is connect ed in an electrically conducting fashion, but galvanically separated by tuning circuit 16 with frequency generator 14. As a result, a high frequency is produced between substrate carrier 21 and the inside wall 5 of reaction chamber 6 that serves as a ground electrode 2, with the level of this frequency being adjusted by frequency generator 14 and being readable on power meter 15. As a result, a bias voltage (self-bias) is produced on the substrate carrier and hence on the substrate as well. An external bias voltage can also be imposed.

Figure 2:
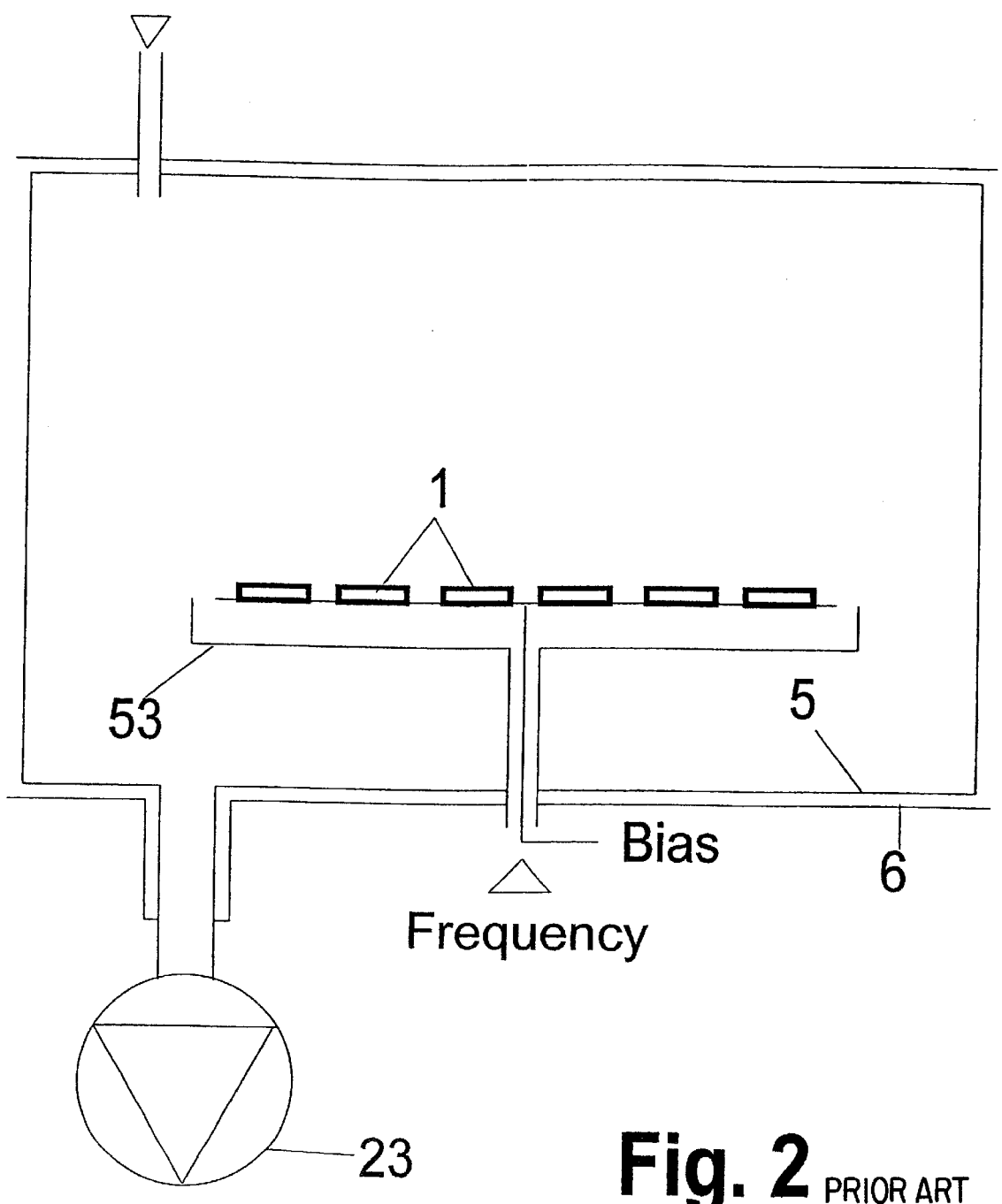
FIG. 2 shows the apparatus in a known RF-PECVD reaction chamber for unilateral coating.

FIG. 2 shows a known reaction chamber according to the prior art in a sectioned view. This reaction chamber has a provision for adding the precursor, usually at the top, while the frequency is introduced from the bottom. Likewise in the lower area, the gases are usually exhausted by means of pump 23 connected there.

With the reaction chamber shown in FIG. 2, substrates 1 are laid flat on a plate located in reaction chamber 6. Below the plate is a shield 53 which is connected with the shielding of the coaxial cable that supplies the frequency and covers the entire underside of the plate and hence of substrates 1.

Then the formation of field lines and hence the coating of substrates 1 mainly takes place on their surfaces or lateral edges.

Figure 3:
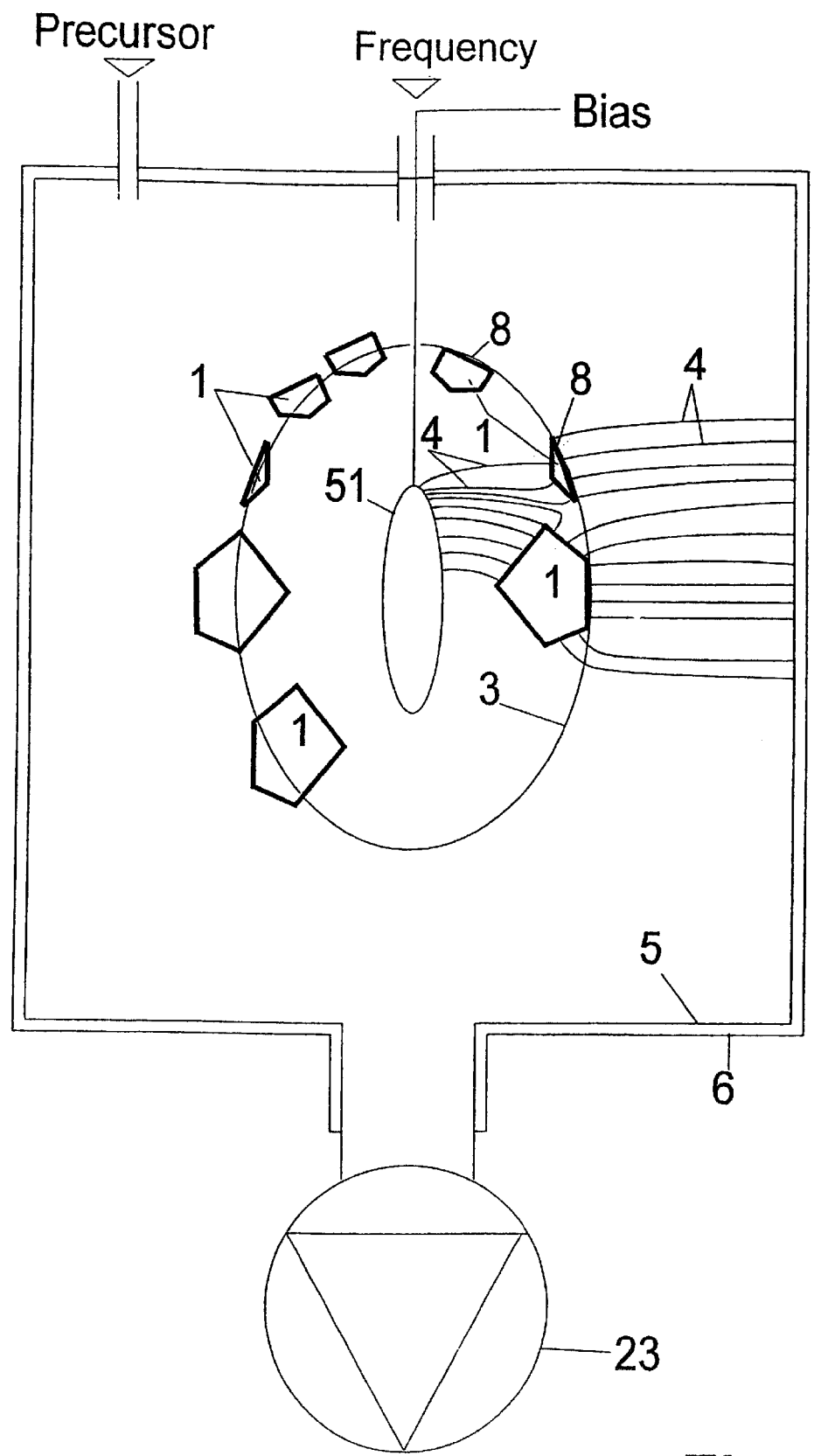
FIG. 3 shows the apparatus in an RF-PECVD reaction chamber according to the invention.

FIG. 3 shows schematically a specific reaction chamber 6 according to the invention in a top view with substrates 1 located therein, as well as the required provisions for admitting the precursor and the frequency. Here again reaction chamber 6 is evacuated by a pump 23.

As shown on the right side of 33, field lines 4 run from the inside wall 5 of the reaction chamber 6 that serves as the ground electrode 2 to the outer surfaces of substrates 1 so that they strike substrates 1 at right angles as well. Substrates 1 are arranged in the shape of an ellipse that forms a clamping surface 3.

A likewise elliptical additional ground electrode 51 is located inside the elliptical clamping surface 3, said electrode having the same potential as the inside wall 5 of a reaction chamber 6 which also serves as a ground electrode. In FIG. 3 as well, substrates 1 are located on a substrate holder, which is not shown however for reasons of clarity.

Therefore, field lines 4 also form between this central ground electrode 51 and the surfaces of the substrates 1, said lines in turn striking the surfaces of the substrates perpendicularly.

The theoretical clamping surface 3 along which substrates 1 are located is defined on the right side of FIG. 3 as the elliptical surface that extends along the outwardly directed main surfaces 8 of the correspondingly aligned substrates 1.

As a result, an especially good coating result is achieved on those main surfaces of the substrates that are aligned along clamping surface 3.

If on the other hand a coating that is uniform as possible is to be produced on all the outer surfaces of substrates 1, according to the left half of FIG. 3, the clamping surface 3 is defined as the clamping surface 3, elliptical in this case, that passes through the center and/or middle points of substrates 1, and substrates 1 are arranged accordingly.

The precursor and the frequency are preferably introduced on the side that is opposite the point at which evacuation is performed by pump 23.

Figure 4:
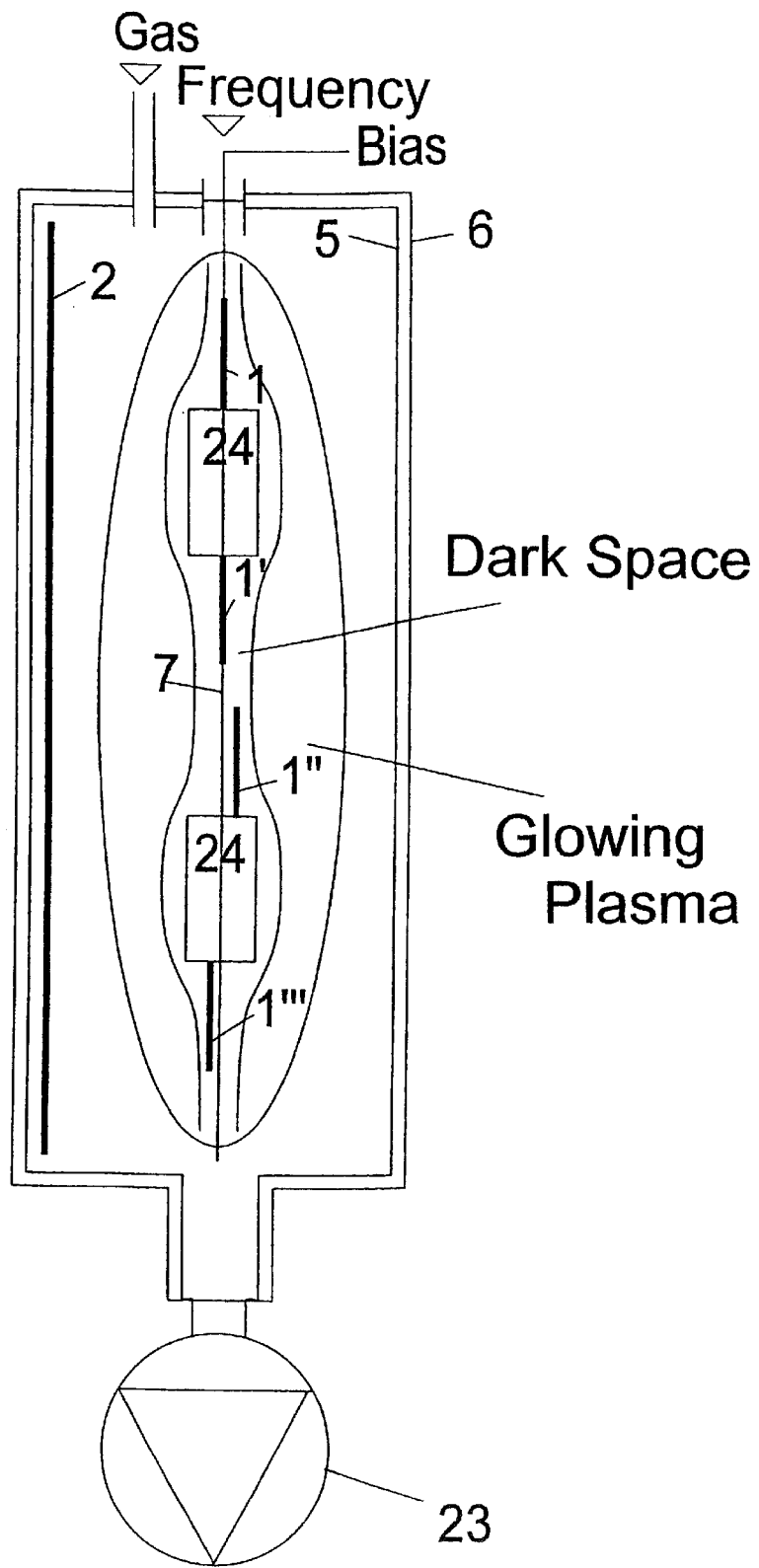
FIG. 4 shows a section through another reaction chamber.

If on the other hand a thin two-dimensional substrate is to be uniformly and completely coated on both sides, according to FIG. 4 these two-dimensional and preferably even plane the substrates 1 to 1" are arranged preferably in the standard plane of the ground electrode, preferably the inside walls 5 of reaction chamber 6, so that the substrates are arranged with their opposite parallel outer surfaces as parallel as possible to this main central plane which then represents the clamping plane 7.

The substrates 1 then spread out on both sides of substrate holders 24 which are likewise located centrally on disk clamping surface 7. Several substrate holders 24 holding. substrates 1 can be arranged in a row on clamping plane 7, as shown in FIG. 4.

With such an arrangement, the field lines (which are not shown in FIG. 4) that are located between the ground electrode, in other words the inside walls 5 of a reaction chamber 6 or of a plate that serves instead as the ground electrode and is also located in the reaction chamber, are directed for the most part perpendicularly against clamping plane 7. A relatively narrow design for the reaction chamber 6 is then recommended, in other words a reaction chamber whose extension is as short as possible, said chamber running transversely to clamping plane 7, relative to the largest possible surfaces that extend parallel to this clamping plane 7.

As shown in FIG. 4, with such an arrangement the so-called dark space forms at a distance around substrates 1 and the thicker substrate holders 24, said dark space being concentrated in lobes at the thickened substrate holders 24. The approximately elliptical glowing plasma can be seen around the entire arrangement of all substrates and substrate holders and their dark spaces.

A good and uniform coating is also achieved if, as shown at the left in FIG. 4, when the substrates 1", which extend from one side of the lower substrate holders 24 opposite the substrates 1'" spreading on the other side of the same substrate holder are offset laterally relative to clamping plane 7 that runs centrally relative to the substrate holder and offset slightly parallel on opposite sides.

In this arrangement as well, the precursor gas and the frequency are introduced on one narrow side of reaction chamber 6 and the gases are drawn off by pump 23 from one of the other narrow sides, preferably the opposite narrow side of reaction chamber 6.

What is claimed is:

1. A method for applying a diamond-like coating to at least one substrate, comprising:

arranging at least one substrate in a reaction chamber on a clamping surface so that field lines extending between the at least one substrate and a ground electrode perpendicularly intersect the clamping surface or a substrate surface; and applying the diamond-like coating to the at least one substrate by plasma-enhanced chemical vapor deposition by exciting a deposition gas atmosphere with electromagnetic radiation and producing an electrical bias voltage between the substrate and at least one ground electrode, wherein the clamping surface is an annular surface and one ground electrode is located inside the clamping surface and another ground electrode is located outside the clamping surface.

2. A method according to claim 1, wherein the at least one substrate is a part of a warp knitting machine.

3. A method according to claim 1, wherein the ground electrode located outside the clamping surface is an inside wall of the reaction chamber.

4. A method according to claim 1, wherein the at least one substrate is arranged on the clamping surface so that a main surface of the at least one substrate to be coated is arranged parallel to clamping surface.

5. A method according to claim 4, wherein the at least one substrate is a plane that is arranged with its surfaces parallel to the clamping surface.

6. A method according to claim 1, wherein 5% to 30% of the clamping surface is covered with the at least one substrate.

7. A method according to claim 6, wherein 10% to 25% of the clamping surface is covered with the at least one substrate.

8. A method according to claim 1, wherein the at least one substrate is arranged along a plurality of clamping surfaces within the reaction chamber.

9. A method according to claim 8, wherein two or more substrates are arranged parallel to one another.

10. A method according to claim 1, wherein the at least one substrate comprises a chrome-plated carbon steel.

11. A method according to claim 1, wherein the at least one substrate comprises uncoated stainless steel.

12. A method according to claim 1, further comprising:
cleaning the at least one substrate; and
applying an adhesion promoter layer to the at least one substrate.

13. A method according to claim 12, wherein a precursor of said adhesion promoter layer comprises a compound that forms a stable and mechanically load-carrying connection with the diamond-like coating or is miscible with the carbon of the diamond-like coating.

14. A method according to claim 13, wherein the compound comprises silicon.

15. A method according to claim 13, wherein the compound comprises germanium.

16. A method according to claim 13, wherein the compound is selected from the group consisting of hexamethyldesilazane, $(CH_3)_6$, $Si_2N$, and a silane.

17. A method according to claim 12, wherein the adhesion promoter layer has a thickness from 10 angstroms to 5 $\mu$m.

18. A method according to claim 12, wherein the adhesion promoter layer has a thickness from 10 to 150 nm.

19. A method according to claim 12, wherein the adhesion promoter layer has a thickness from 10 to 50 nm.

20. A method according to claim 12, further comprising maintaining a pressure from $5\times10^{-3}$ mbar to $5\times10^{-1}$ mbar during at least one of the applying of the adhesion promoter layer and the diamond-like layer.

21. A method according to claim 20, wherein the pressure is from $2\times10^{-2}$ mbar to $20\times10^{-2}$ mbar.

22. A method according to claim 20, wherein the pressure is $5\times10^{-2}$ mbar.

23. A method according to claim 12, further comprising applying a bias voltage of 100 to 1000 volts during at least one of the applying of the adhesion promoter layer and the diamond-like coatinq.

24. A method according to claim 23, wherein the bias voltage is from 200 to 700 volts.

25. A method according to claim 23, wherein the bias voltage is from 400 to 500 volts.

26. A method according to claim 1, wherein the excitation is at a frequency in the kHz range up to a maximum in the microwave range.

27. A method according to claim 26, wherein the frequency is in the radio wave range.

28. A method according to claim 27, wherein the frequency is 13.56 MHz.

29. A method according to claim 1, further comprising applying a magnetic field at a pressure of 1 to $5\times10^{-4}$ mbar.

30. A method according to claim 1, further comprising heating the substrate directly.

31. A method according to claim 1, wherein precursors for the deposition gas comprise methane, butane, hexane, acetylene, or mixtures thereof.

32. A method according to claim 1, wherein the diamond-like layer has a thickness of 2 to 6 $\mu$m.

33. A method according to claim 32, wherein the diamond-like coating has a thickness of 2 to 3 $\mu$m.

34. A method according to claim 1, wherein the diamond-like coating comprises a material selected from the group consisting of polycrystalline diamond, microcrystalline diamond, amorphous carbon, and amorphous hydrogenated carbon.

35. A method according to claim 1, wherein the clamping surface extends through the at least one substrate.

36. A method according to claim 1, wherein a surface of the at least one substrate is located on or is parallel to the clamping surface.

37. A method for applying a diamond-like coating to at least one substrate, comprising:
arranging at least one substrate having outer surfaces and a hole or cavity in a reaction chamber on a clamping surface so that field lines extending between the at least one substrate and a single ground electrode perpendicularly intersect a clamping surface or a substrate surface; and applying the diamond-like coating to the at least one substrate by plasma-enhanced chemical vapor deposition by exciting a deposition gas atmosphere with electromagnetic radiation and producing an electrical bias voltage between the substrate and at least one ground electrode, wherein an outer surface of the at least one substrate is located on one side of the clamping surface and second outer surface is located on another side of the clamping surface, and wherein the clamping surface is a plane.

38. A method according to claim 37, wherein the plane is a plane of a three-dimensional arrangement of a plurality of ground electrodes.

* * * * *